United States Patent [19]

Fukuyama et al.

[11] 4,381,446
[45] Apr. 26, 1983

[54] PHOTOELECTRIC SWITCH

[75] Inventors: Toshifumi Fukuyama, Otokuni; Norio Onji, Kyoto, both of Japan

[73] Assignee: Omron Tateisi Electronics Co., Kyoto, Japan

[21] Appl. No.: 278,426

[22] Filed: Jun. 29, 1981

[30] Foreign Application Priority Data

Jun. 30, 1980 [JP] Japan ............................. 55-89555

[51] Int. Cl.³ ........................................ H01J 40/14
[52] U.S. Cl. ............................. 250/214 R; 307/311
[58] Field of Search ........... 250/221, 222, 574, 214 R; 307/311

[56] References Cited

U.S. PATENT DOCUMENTS 4,207,466 6/1980 Drage et al. .................. 250/221 X Primary Examiner—David C. Nelms
Assistant Examiner—Darwin R. Hostetter
Attorney, Agent, or Firm—Schwartz, Jeffery, Schwaab, Mack, Blumenthal & Koch

[57] ABSTRACT

There is provided a photoelectric switch comprising a light projecting segment including a pulse oscillator and a light-emitting element adapted to give a pulse light emission in response to an output pulse of the pulse oscillator, a light reception segment including a light reception element adapted to yield a light reception signal on incidence of light, a gate circuit adapted to gate the light reception signal according to the output pulse of the pulse oscillator and an integration circuit for integrating outputs of the gate circuit, and a control circuit for varying the pulse frequency by controlling the pulse oscillator on generation of a light reception signal from the light reception element.

5 Claims, 13 Drawing Figures

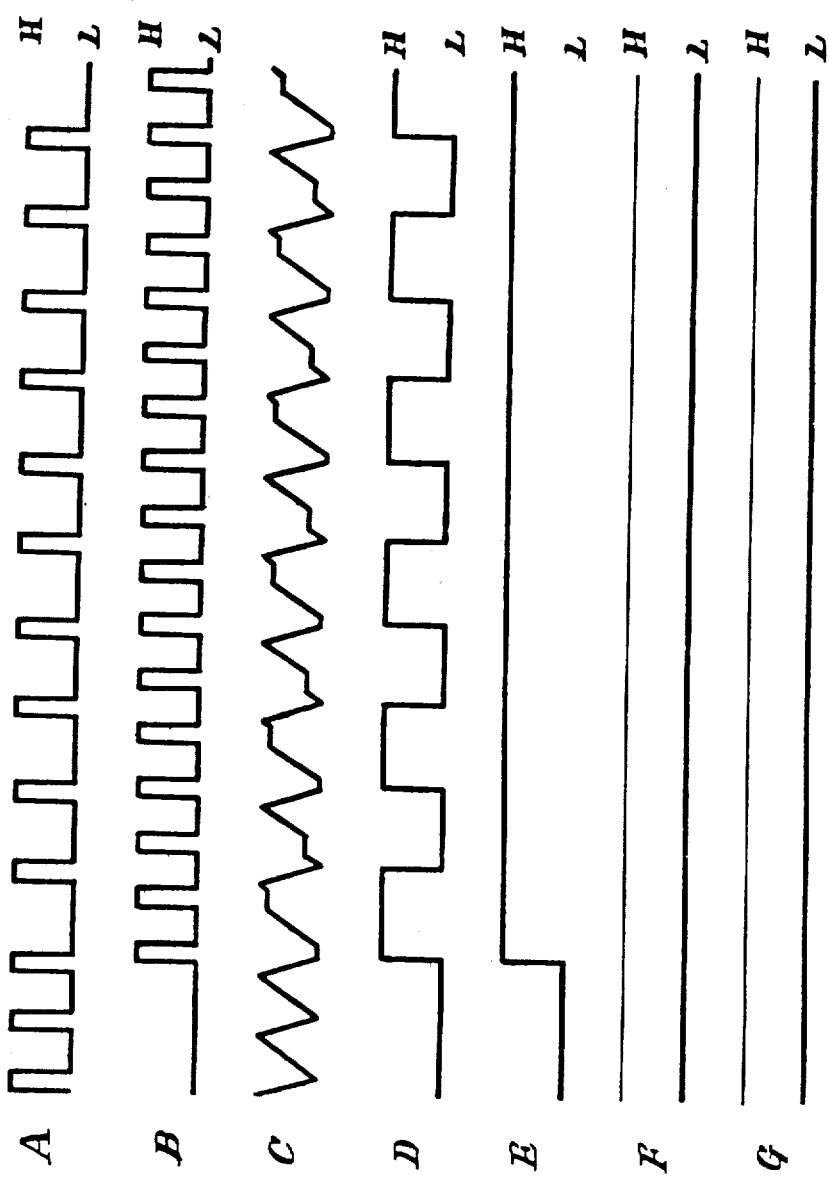

PHOTOELECTRIC SWITCH

BRIEF SUMMARY OF THE INVENTION

This invention relates to a photoelectric switch of pulse modulated light type where a pulse light is projected and a light reception signal synchronized with this pulse light is selectively detected.

More particularly, this invention relates to a photoelectric switch of pulse modulated light type comprising an improved circuit construction free from erratic operations which would arise on response of the switch to any noise light having a frequency similar to that of its intrinsic pulse light such as pulse light from other photoelectric switches.

Any photoelectric switch of pulse modulated light type employs a synchronized gate construction wherein only a light reception input synchronized with a pulse of projected light only is taken out while all other light reception inputs entering at other times are excluded so that erratic operations are effectively precluded against non-continual noise light. Actually, however, a plurality of photoelectric switches are put to use as arranged in adjacent locations as illustrated at 1A in FIG. 1. If, in such an arrangement, the projection ranges of light projecting segments 1T and 2T of two adjacent photoelectric switches and the light reception ranges of light receiving segments 1R and 2R of the same switches are broad enough, light from the light projecting segment 2T of a second photoelectric switch 2 enters the light receiving segment 1R of the first photoelectric switch 1 even when light from the light projecting segment 1T of the first photoelectric switch 1 is intercepted by an object 3 to be detected. It has been so designed that pulse lights of different phases and frequences are projected from the light projecting segments 1T and 2T but the frequencies of such pulse lights are often close enough to each other and, consequently, the timings of light pulses from the light projecting segments 1T and 2T often coincide with each other, in which event the influence of projected light from adjacent photoelectric switches cannot be excluded by the synchronized gate system alone.

Therefore, it has heretofore been attempted, as shown in FIG. 1B, to reduce the effective ranges of the light projecting segments 1T and 2T and light receiving segments 1R and 2R so that projected light from a photoelectric switch will not be incident on the light receiving segment of an adjacent photoelectric switch. In such an arrangement, however, it is difficult to align the optical axes of the corresponding light projecting segment and light receiving segment and the arrangement has the disadvantage that if the optical axis is disturbed even a little owing to vibrations or an impact, the operation of the switch becomes erratic.

It has also been proposed, as illustrated in FIG. 1C, to arrange light projecting segments 1T, 2T and light receiving segments 1R, 2R in alternating positions but this arrangement has the disadvantage that if the surface reflectance of an object 3 to be detected is high, reflected light becomes incident on the light receiving segment of another photoelectric switch.

Furthermore, for a system where a plurality of light projecting segments are arranged in parallel, it has been contemplated to cancel out the mutual interference of such plurality of light projecting segments by ensuring that these segments do not project light simultaneously but project light in a sequence and providing a gate circuit adapted to pass only coincidental light reception signals. However, it is then necessary to employ a control circuit for such successive projections of light as well as electrical connections for transmitting synchronizing signals to the respective light projecting and receiving segments. These not only means that the construction of the switch and the assembling operation therefor are complicated but also cause the disadvantage that the several photoelectric switches cannot be used independently.

Having been conceived and developed under the above circumstances, the present invention has as its object to provide a photoelectric switch which has sufficiently broad light projecting and receiving ranges to ensure a ready adjustment of its optical axes and yet does not require electrical interconnections in applications where a plurality of units thereof are installed in side-by-side relation and which, moreover, is free from operation errors thanks to the absence of interferences by projected light from adjacent units.

BRIEF DESCRIPTION OF DRAWINGS

FIG. 3 is a time chart showing the waveforms at A through G of FIG. 2;

DETAILED DESCRIPTION

Figure 1A:
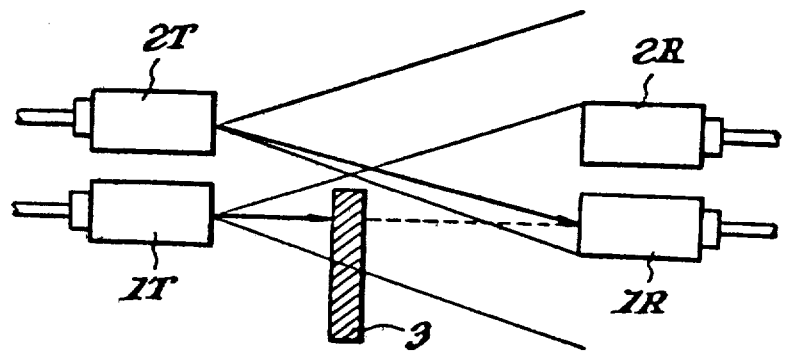
FIGS. 1A, 1B and 1C each is a schematic plan view showing the relative position of the light projecting and receiving segments of a photoelectric switch.
Figure 1B:
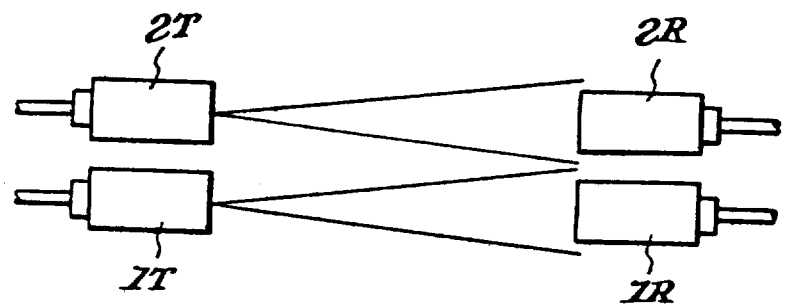
Figure 1C:
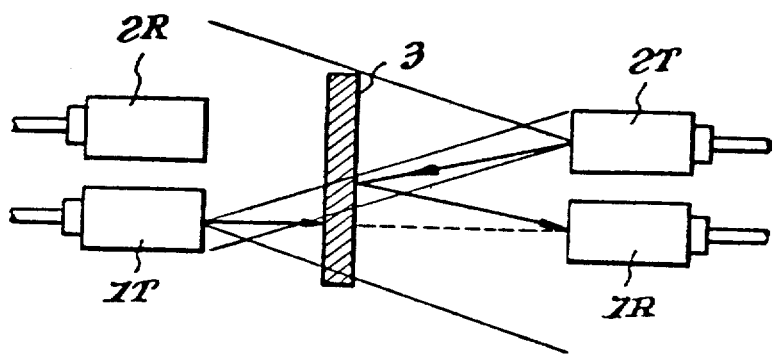
Figure 2:
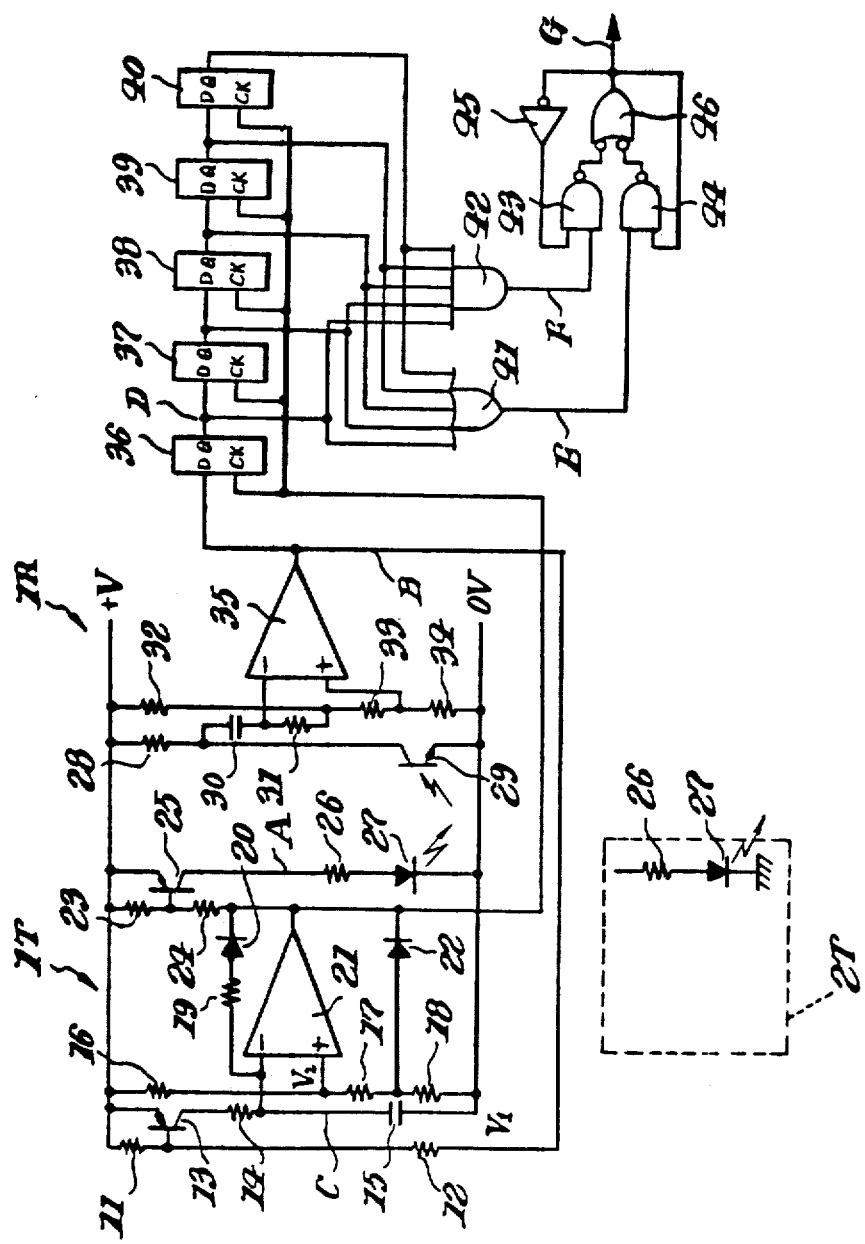
FIG. 2 is a circuit diagram representing an embodiment of this invention.

This invention will be described in detail by way of preferred embodiments thereof which are illustrated in the accompanying drawings. Referring to FIG. 2, the photoelectric switch of this invention includes a light-projecting segment 1T which is equipped with an RC self-exciting pulse oscillator consisting of resistances 14, 16, 17, 18, 19, a capacitor 15, diodes 20, 22 and a comparator 21, and a transistor 13 is connected in series with the resistance 14 and the time constant circuit of the capacitor 15 so as to constitute a control circuit together with resistances 11, 12. The pulse output of the pulse oscillator is fed to a light-emitting diode (LED) 27 via a current amplifying circuit consisting of resistances 23, 24 and a transistor 25 and a resistance 26. A light-receiving segment 1R comprises a waveform shaping circuit consisting of a phototransistor 29, resistances 28 and 31 to 34, a capacitor 30 and a comparator 35 so that only the output signals of phototransistor which have wave heights greater than a predetermined height are converted to rectangular waveforms by said waveform shaping circuit. Such a light reception signal as has thus been shaped into a rectagular waveform is transmitted to a shift-register consisting of five flip-flops 36 to 40. Each of these flip-flops uses the pulse of said pulse oscillator as a clock pulse and is designed so that it is energized in timed relation with said clock pulse. Therefore, the first-stage flip-flop 36 functions as a gate circuit which gates in response to the pulse of said pulse oscillator. The output of each flip-flop is applied to an OR gate 41 and an AND gate 42 and when 5 consecutive light reception signals are fed to this shift-register, the output of the AND gate 42 becomes "H". The output of OR gate 41 is "H" when the output of any of the five flip-flops is "H", while it is "L" when the outputs of all flip-flops are "L", i.e. when there is no light reception signal in succession for a time corresponding to 5 clock pulses.

It will thus be understood that said shift-register functions as an integrating circuit of the digital type. (An analog integrating circuit can likewise be employed. In that case, a couple of integration output level detection circuits are provided in lieu of said OR gate 41 and AND gate 42 in such a manner that one of the detection levels corresponds to the integration output which is the case where one light reception signal occurs in a predetermined time interval while the other detection level corresponds to the integration output which is reached when five consecutive light reception signals have occurred.) The outputs of said OR gate 41 and AND gate 42 are applied to a flip-flop consisting of NAND gates 43, 44, NOR gate 46 and a NOT circuit 45.

Now, the operation of this embodiment will be explained with reference to the time chart of FIG. 3 showing the signal waveforms at A to G of FIG. 2. FIG. 3A represents the waveform of a lighting current of LED 27, which is also the pulse waveform of the pulse oscillator and the clock pulse waveform of the shift-register, too. Let it be assumed that the projected light from this LED 27 is intercepted by an object to be detected (not shown) and that the pulse light projected from the LED 27 of the other light projecting segment 2T is incident on the phototransistor 29 to produce a light reception signal as shown in FIG. 3B. If the timing of this light reception signal agrees with that of the clock pulse, the output D of the flip-flop 36 becomes "H" as shown in FIG. 3D. Now, since the transistor 13 is OFF when the light reception signal B is "H", the charging of the capacitor 15 is temporarily suspendended while the light reception signal B is "H". Consequently as shown in FIG. 3C, the increase of charging voltage of the capacitor 15 is temporarily arrested to delay the next pulse.

Figure 4A:
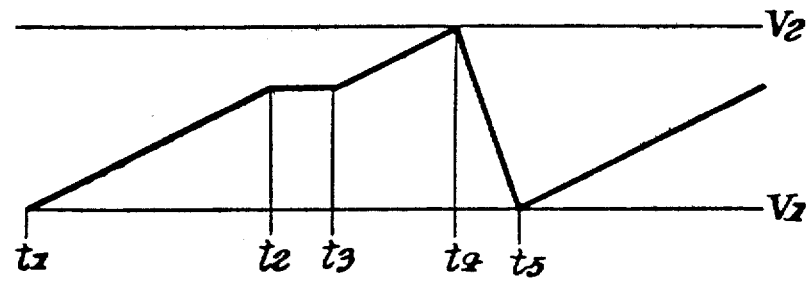
FIGS. 4A and 4B are time charts showing the charging voltage waveforms of the capacitor 15 shown in FIG. 2.
Figure 4B:
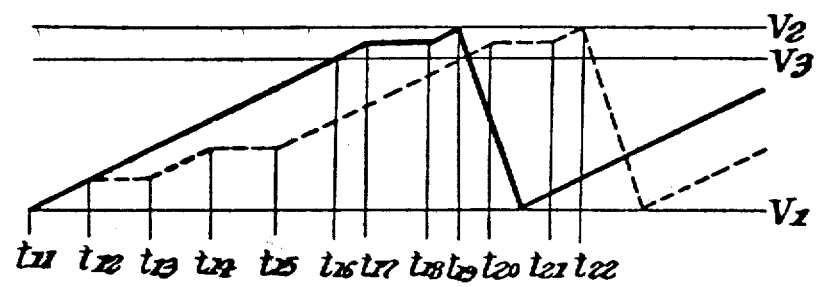

The electric potential at this point C is shown on exaggerated scale in FIGS. 4A, 4B. Referring to FIG. 4A, charging starts at the time-point $t_1$ and as the charging voltage of the capacitor 15 increases from the reference voltage $V_1$ (OV), the light reception signal becomes "H" between time-points $t_2$ to $t_3$ whereupon the transistor 13 is turned OFF and the charging current is interrupted, with the result that the increase of electric potential stops during this time period. After the time-point $t_3$, as the transistor 13 is turned ON, charging takes place again. Then, at the time-point $t_4$, the charging voltage reaches a reference voltage $V_2$ which is dictated by resistances 16, 17 and 18, whereupon the comparator 21 is reversed and its output becomes "L". As a result, the electric charge of the capacitor 15 flows via resistance 19 and diode 20 to the output side of the comparator 21, so that discharging is completed until the time-point $t_5$ has arrived. During this time period $t_4$-$t_5$, the transistor 25 is ON and a pulse current flows to LED 27 to project a pulse light. If the phototransistor 29 receives its own projection light to produce a light reception output, the transistor 13 is turned OFF because the capacitor 15 of the pulse oscillator has already been in a discharging mode so that there is no influence of the suspension of charging of the capacitor 15.

In this manner, if projected light from an adjacent photoelectric switch is incident, the action of the pulse oscillator is temporarily suspended to delay projection of light and because the pulse light is thus produced at a timing not synchronous with that of light projection of the other photoelectric switch, there is no conflict of light form two adjacent switches. Thus, it is absolutely not probable that any five successive light projections from one switch coincide with five successive light projections form the other switch. This means that there will be no output from the AND gate 42 and the output G will never become "H".

Moreover, even if, aside from projected light from an adjacent photoelectric switch, noise light is incident, the pulse oscillator remains idle as long as the noise light persists and it is only after a cessation of the noise light that the light pulse and clock pulse are generated, thus making it possible to preclude operation errors due to noise light.

While the construction described above is capable of precluding operation errors, it has the disadvantage that, as shown by broken lines in FIG. 4B, the idling time of the pulse oscillator is prolonged as the quantity of incident noise light is large, with the result that the frequency of projected light pulse and that of clock pulse of the shift-register are also increased. Consequently, the time before all the flip-flops 36 to 40 of the shift-register become "H" or "L" is also increased and ultimately the response time of the photoelectric switch is increased.

Figure 5:
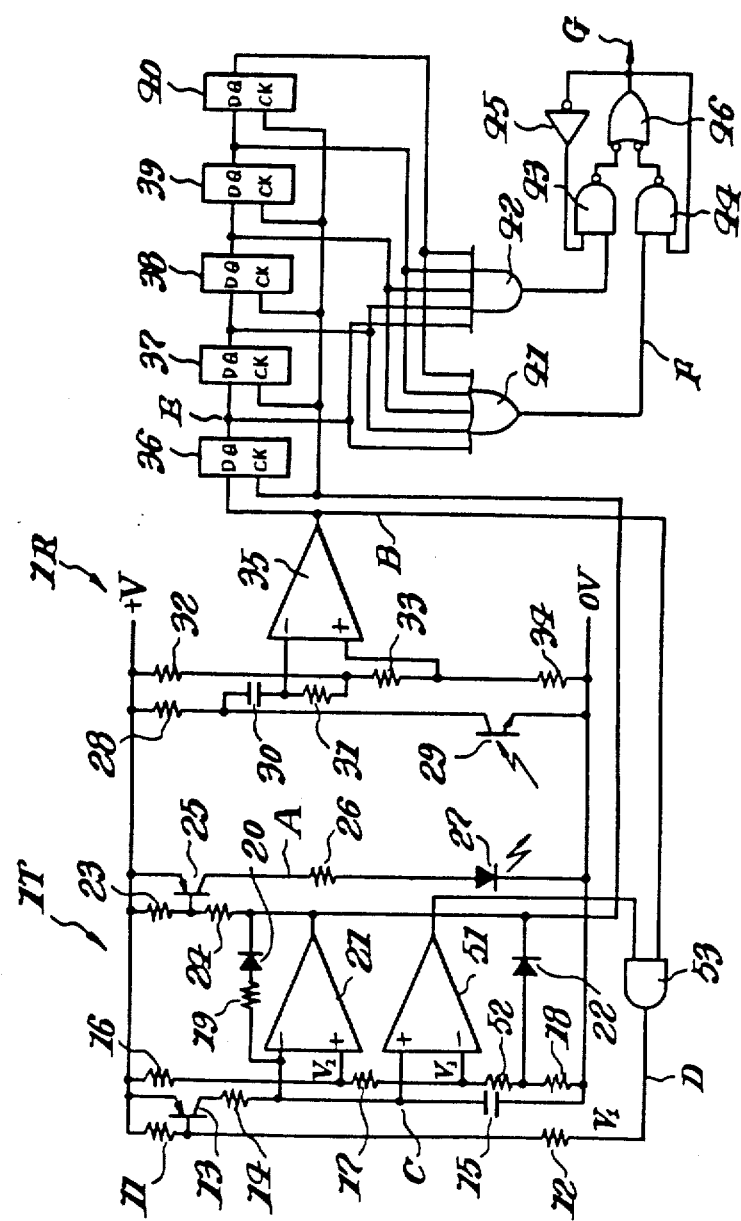
FIGS. 5, 7 and 9 are circuit diagrams showing other embodiments of this invention.
Figure 6:
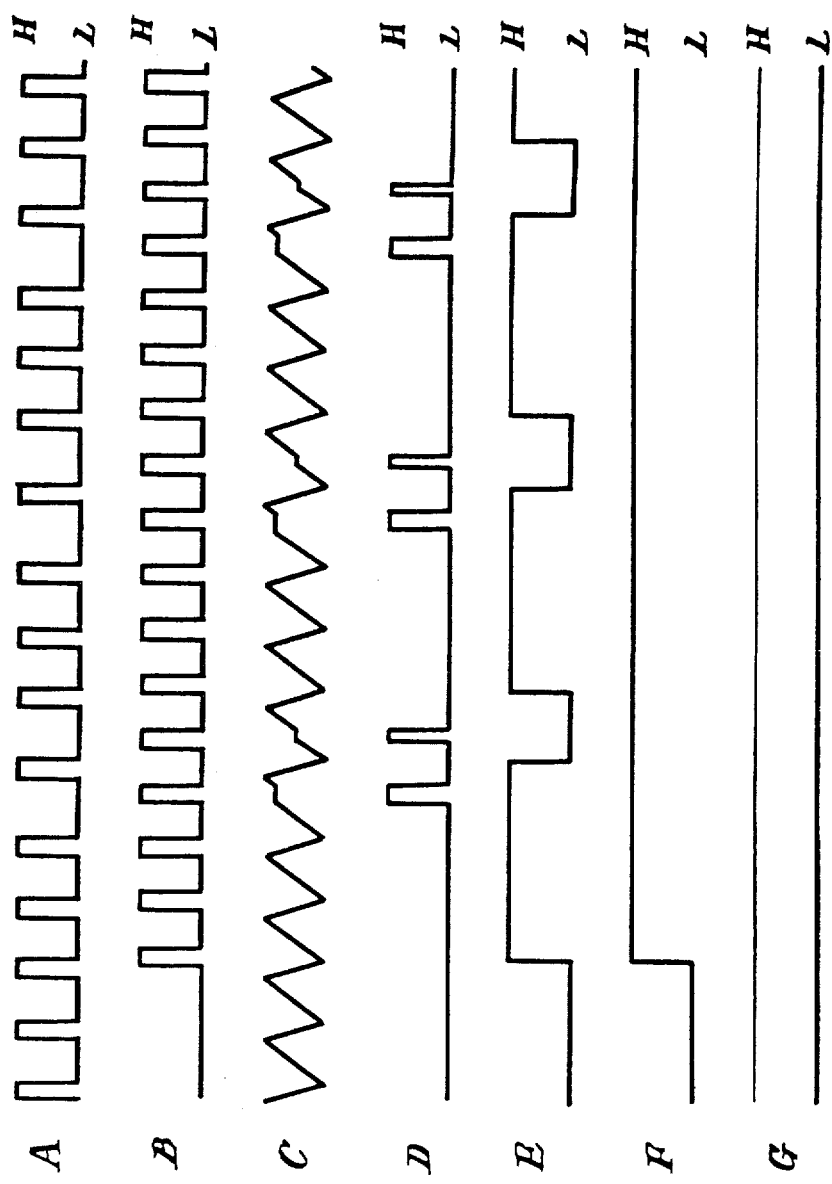
FIGS. 6, 8 and 10 are time charts showing the signal waveforms of the circuits shown in FIGS. 5, 7 and 9, respectively.

The embodiment depicted in FIG. 5 represents an improvement in the above aspect. It is only that fraction of light from an adjacent photoelectric switch which is incident on a principal switch immediately before the projection of light from the latter switch that matters actually and the light incident on the latter from the former switch at other times is not relevant. Therefore, as illustrated in FIG. 5, there is provided an AND gate 53 for gating reception signals so that the transistor 13 will not be turned OFF by reception signals other than the signals coming immediately before the projection of light. This timing, i.e. immediately before the projection of light, can be ascertained from the charging voltage of the capacitor 15. With the addition of a comparator 51 and a resistance 52, the reference voltage of this comparator 21 is set at $V_3$ which is slightly lower than the reference voltage $V_2$ of the comparator 21. Under the circumstances, because the output of comparator 51 is "L" during the period $t_{11}$ to $t_{16}$, i.e. while the voltage of capacitor 15 is not more than $V_3$ as shown by solid lines in FIG. 4B, the light reception signal is inhibited by the AND gate 53 so that the transistor is not turned OFF. After the time-point $t_{16}$, the output of comparator 51 becomes "H" and, therefore, the light reception signal passes through the AND gate 53 and the transistor 13 is turned OFF in accordance with the light reception signal, whereby charging of the capacitor 15 is stopped. Therefore, as comparison with the broken lines of FIG. 4B will show clearly, the pulse frequency of the pulse oscillator is shortened. The signal waveform at each of the points A to G of FIG. 5 is shown in the time chart of FIG. 6.

In the embodiment depicted in FIG. 5, the operation error due to noise light can be precluded and the delay in response time can be minimized. This response time can be diminished by making $V_3$ as near as $V_2$ in FIG. 4B.

Figure 7:
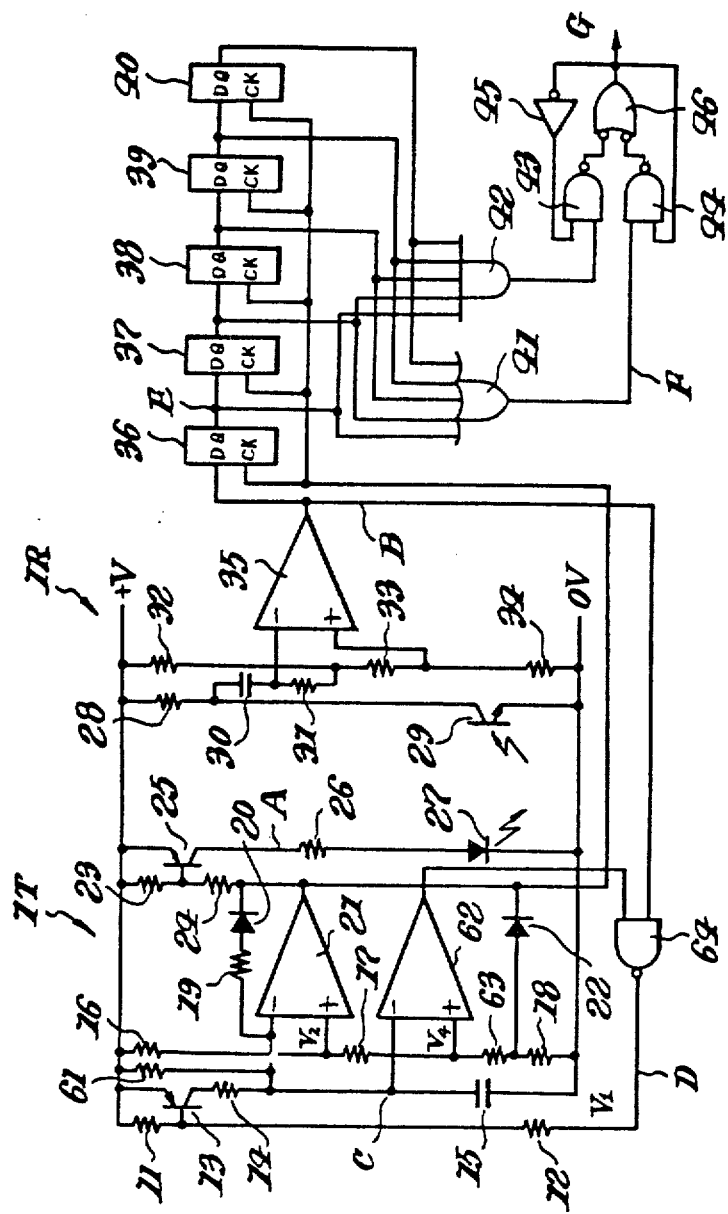
Figure 8:
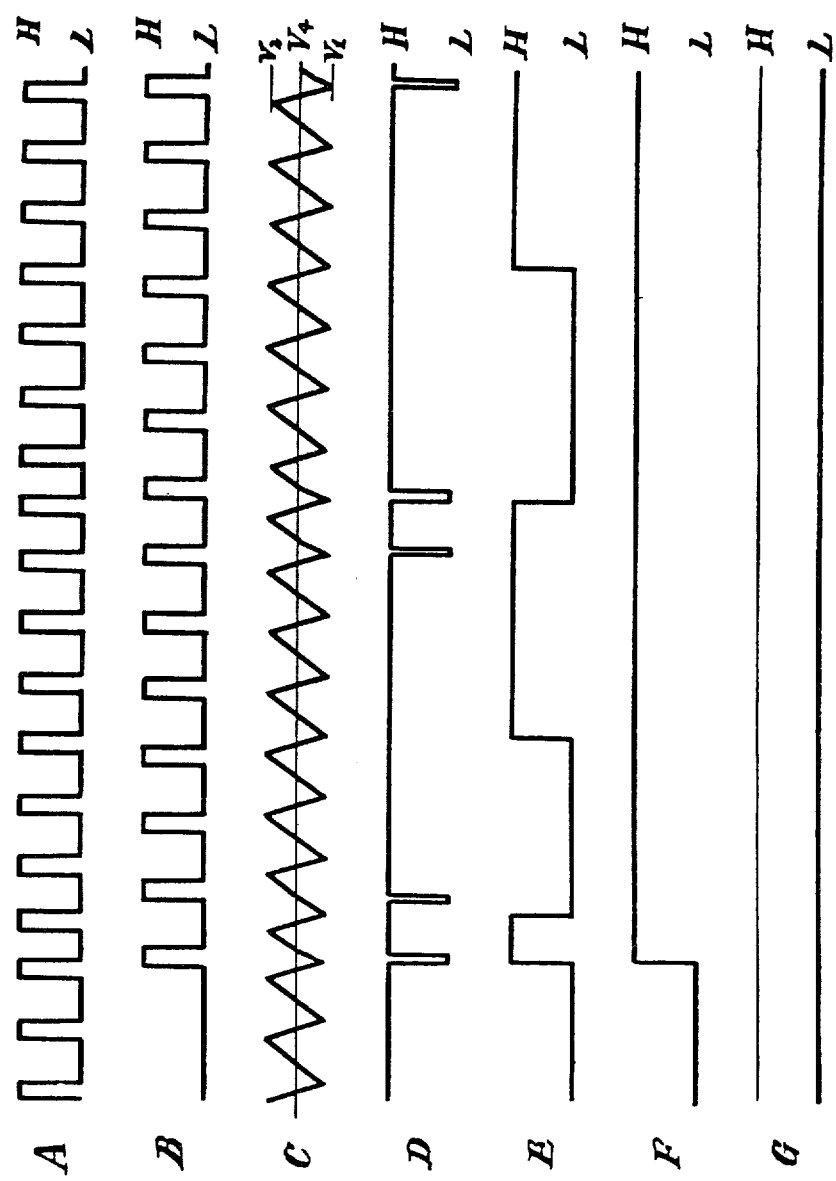

In the foregoing two embodiments, when a light reception signal occurs due to noise light, the action of the pulse oscillator is temporarily suspended to delay the generation of the next pulse. However, the timing of generation of the next pulse may be rather advanced. In the embodiment of FIG. 7, the transistor 13 is normally OFF and the capacitor 15 is charged through a resistance 61. On generation of a light reception signal due to noise light, the transistor 13 is turned ON to charge the capacitor 15 via resistances 61 and 14 so as to quicken the potential increase of the capacitor 15 and to thereby advance the timing of generation of the next pulse. In this case, if an attempt is made to advance the timing of generation of the pulse by means of the light reception signal immediately prior to the generation of a pulse from the pulse oscillator circuit, there will be the disadvantage that the timing will rather coincide with that of noise light. Therefore, there is provided a comparator 62 for detecting the charging voltage of the capacitor 15. This reference voltage $V_4$ is set lower than the reference voltage $V_2$ of the comparator 21 and its output is sent to a NAND gate 64 to gate the light reception signal. As a result, during the time till the voltage of the capacitor 15 reaches $V_4$, the output of comparator 62 is "H" and the transistor 13 is turned ON only by the light signal generated during this period. The signal waveform at each of the points A to G of FIG. 7 is shown in the time chart of FIG. 8. In FIG. 8, the voltage $V_4$ has been set approximately midway of the voltage range $V_1$-$V_2$ of capacitor 15. Therefore, in this embodiment, the timing of the next pulse is advanced only by the noise light arriving in the first half of the pulse interval.

Figure 9:
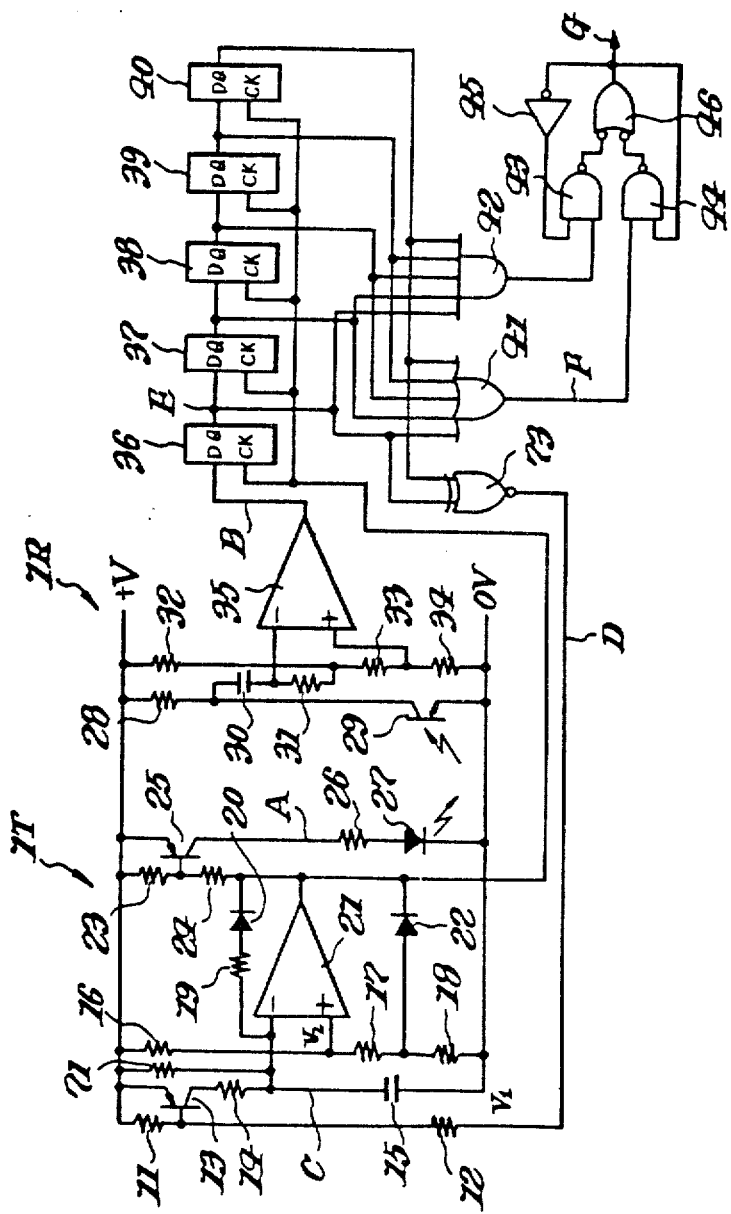
Figure 10:
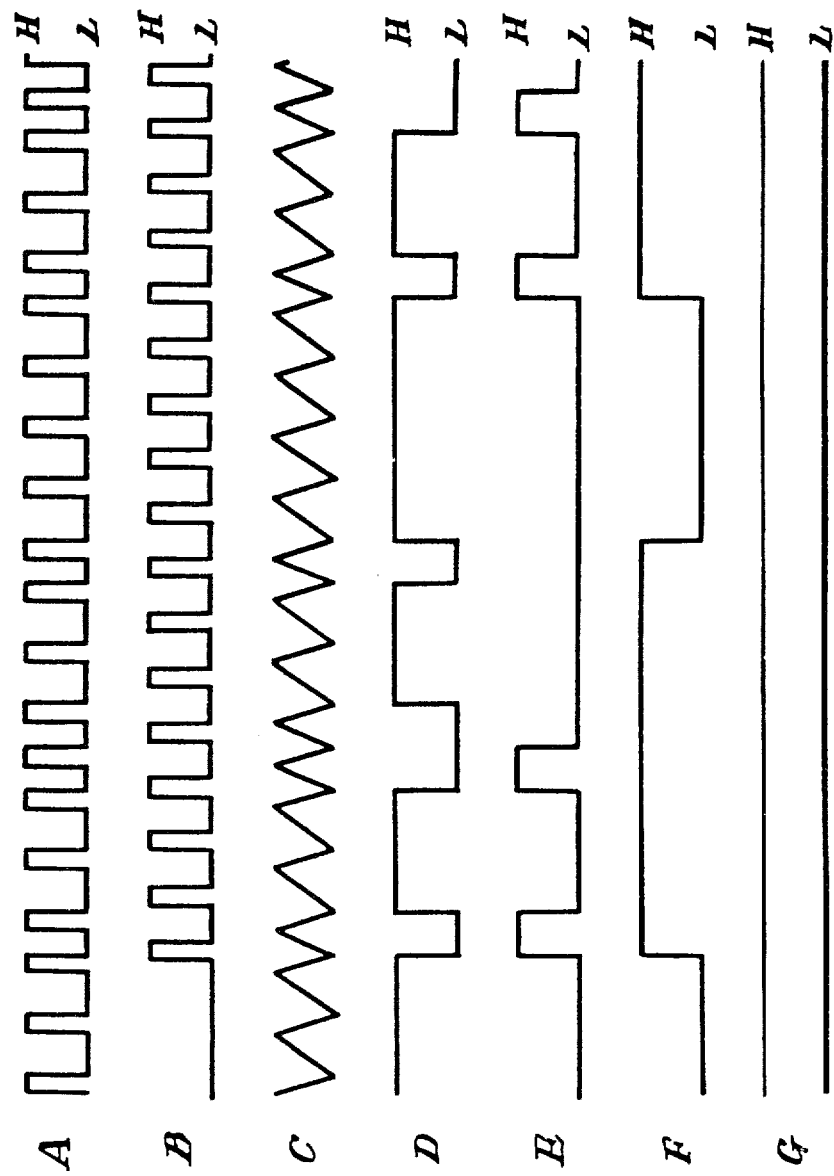

The embodiment illustrated in FIG. 9 is similar to the embodiment of FIG. 7 but is distinct in that the output of the first-stage flip-flop 36 of the shift-resister and the output of the last-stage flip-flop 40 are fed to an exclusive-or circuit 73 so that the output of the latter will control the transistor 13. The signal waveform of each of the points A to G of this circuit is shown in the time chart of FIG. 10. It will be seen from FIG. 10 that assuming that when no light reception signal is existent at first, the outputs of all the flip-flops 36 to 40 are invariably "L", the output of the exclusive-or circuit 73 is "H" and, therefore, the transistor 13 is OFF. Thus, the capacitor 15 is charged via resistance 71. Therefore, pulses are generated at a frequency determined by the time-constant of the capacitor 15 and the resistance 71. Let it be further assumed that noise light is incident at this time to generate a light reception signal and that the timing of this light reception signal coincides with that of the pulse of the pulse oscillator. Then, only the output of the flip-flop 36 is "H" and, therefore, the output of the exclusive-or circuit 73 becmes "L" and the transistor 13 ON, thus advancing a charging of the capacitor 15. As a result, if this noise light is originating from another photoelectric switch, the next pulse light will not overlap with the pulse of the pulse oscillator and when the next pulse occurs, the output of the flip-flop 36 is "L", the output of flip-flop 37 is "H", and the outputs of the other flip-flops are "L". Accordingly, the output of the exclusive-or circuit 73 becomes "H" and the pulse frequency of the pulse oscillator returns to the original frequency. Since the pulse frequency is shortened in the above manner, even if a pulse light from another photoelectric switch is incident, the light projection timings of the two switches will not overlap over a duration of 5 pulses on ends and, therefore, the output of the AND gate 42 will not become "H". As the object to be detected moves from a light-intercepting position to a light-incident position so that the switch receives its own projected light, the outputs of all the flip-flops 36 to 40 which were intially "H" becomes "H" in succession so that the output of the exclusive-or circuit 73 is "L" during the duration of 5 pulses till all the flip-flops have become "H". As a result, the pulse frequency is accordingly shortened. Similarly, the outputs of flip-flops 36 and 40 differ from each other over a duration of 5 pulses also when the object moves from a light-incident position to a light-intercepting position, and, therefore, the pulse frequency is shortened during this period. Thus, in such, cases, the frequency of the clock pulse driving the shift-register is shortened so that the response time of the photoelectric switch is reduced. Since this shortened pulse frequency determines the response time, if it is previously set at a necessary response time, the pulse frequency is prolonged in the normal state where there will be no reversal of output, so that the mean current to the LED 27 is decreased. Accordingly, degradation of the LED 27 itself is prevented and the power consumption of the switch is decreased.

Several preferred embodiments of the present invention have been described. Because, in the present invention, the pulse frequency of the pulse oscillator is varied on incidence of noise light from adjacent photoelectric switches or other noise sources, there is no possibility of projected light pulses overlapping with noise light over a duration of several pulses and, therefore, erratic operations are precluded. Moreover, since the light projection and reception ranges of the switch are as broad as desired, it is easy to align their optical axes and, moreover, no electrical interconnections are needed in applications where a plurality of units of the switch are arranged in side-by-side relation.

It should be understood that the above description is merely illustrative of the present invention and that many changes and modifications may be made by those skilled in the art without departing from the scope of the appended claims.

What is claimed is:

1. A photoelectric switch comprising a light projecting segment including a pulse oscillator and a light-emitting element adapted to give a pulse light emission in response to an output pulse of said pulse oscillator, a light reception segment including a light reception element adapted to yield a light reception signal on incidence of light, a gate circuit adapted to gate said light reception signal according to said output pulse of said pulse oscillator and an integration circuit for integrating outputs of said gate circuit, and a control circuit for varying the pulse frequency by controlling said pulse oscillator on generation of a light reception signal from said light reception element.

2. A photoelectric switch comprising a light projecting segment including a pulse oscillator and a light-emitting element adapted to give a pulse light emission in response to an output pulse of said pulse oscillator, a light reception segment including a light reception element adapted to yield a light reception signal on incidence of light, a gate circuit adapted to gate said light reception signal according to said output pulse of said pulse oscillator and a control circuit for delaying a next pulse by stopping temporarily the action of said pulse oscillator in response to a light reception signal generated from said light reception element during a period where there is no pulse output from said pulse oscillator.

3. A photoelectric switch comprising a light projecting segment including a pulse oscillator and a light-emitting element adapted to give a pulse light emission in response to an output pulse of said pulse oscillator, a light reception segment including a light reception element adapted to yield a light reception signal on incidence of light, a gate circuit adapted to gate said light reception signal according to said output pulse of said pulse oscillator and a control circuit for delaying a next pulse by stopping temporarily the action of said pulse oscillator in response to a light reception signal generated from said light reception signal during a period immediately before generation of a pulse from said pulse oscillator.

4. A photoelectric switch comprising a light projecting segment including a pulse oscillator and a light-emitting element adapted to give a pulse light emission in response to an output pulse of said pulse socillator, a light reception segment including a light reception element adapted to yield a light reception signal on incidence of light, a gate circuit adapted to gate said light reception signal according to said output pulse of said pulse oscillator and a control circuit for advancing the timing of generation of a next pulse by quickening temporarily the action of said pulse oscillator in response to a light reception signal generated from said light reception element during a period immediately following generation of a pulse from said pulse oscillator.

5. A photoelectric switch comprising a light projecting segment including a pulse oscillator and a light-emitting element adapted to give a pulse light emission in response to an output pulse of said pulse oscillator, a light reception segment including a light reception element adapted to yield a light reception signal on incidence of light, a gate circuit adapted to gate said light reception signal according to said output pulse of said pulse oscillator and a control circuit for shortening the pulse frequency of said pulse generator in response to the output of said gate circuit.

* * * * *